US009112148B2

(12) United States Patent
Chang et al.

(10) Patent No.: US 9,112,148 B2
(45) Date of Patent: Aug. 18, 2015

(54) RRAM CELL STRUCTURE WITH LATERALLY OFFSET BEVA/TEVA

(71) Applicant: Taiwan Semiconductor Manufacturing Co., Ltd., Hsin-Chu (TW)

(72) Inventors: Chih-Yang Chang, Yuanlin Township (TW); Wen-Ting Chu, Kaohsiung (TW); Kuo-Chi Tu, Hsin-Chu (TW); Yu-Wen Liao, New Taipei (TW); Hsia-Wei Chen, Taipei (TW); Chin-Chieh Yang, New Taipei (TW); Sheng-Hung Shih, Hsinchu (TW); Wen-Chun You, Dongshan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/041,514

(22) Filed: Sep. 30, 2013

(65) Prior Publication Data
US 2015/0090949 A1    Apr. 2, 2015

(51) Int. Cl.
*H01L 45/00*    (2006.01)
(52) U.S. Cl.
CPC ............ *H01L 45/1253* (2013.01); *H01L 45/04* (2013.01); *H01L 45/1233* (2013.01); *H01L 45/16* (2013.01); *H01L 45/06* (2013.01); *H01L 45/065* (2013.01); *H01L 45/08* (2013.01); *H01L 45/085* (2013.01); *H01L 45/10* (2013.01); *H01L 45/12* (2013.01); *H01L 45/122* (2013.01); *H01L 45/124* (2013.01); *H01L 45/1206* (2013.01); *H01L 45/126* (2013.01); *H01L 45/1213* (2013.01); *H01L 45/1226* (2013.01); *H01L 45/1246* (2013.01); *H01L 45/1266* (2013.01); *H01L 45/1273* (2013.01);
(Continued)

(58) Field of Classification Search
CPC ........................................ H01L 45/04–45/1691
USPC ............................................................. 257/4
IPC ..................................................... H01L 45/1233
See application file for complete search history.

(56) References Cited

U.S. PATENT DOCUMENTS 7,122,854 B2 * 10/2006 Fukuzumi ...................... 257/295
7,220,599 B2 *  5/2007 Park et al. ......................... 438/3
(Continued)

OTHER PUBLICATIONS

Wolf, S "Silicon Processing for the VLSI Era" vol. 1 copyright 2000 pp. 821.*

(Continued)

*Primary Examiner* — Eva Y Montalvo
*Assistant Examiner* — Grant Withers
(74) *Attorney, Agent, or Firm* — Eschweiler & Associates, LLC

(57) ABSTRACT

The present disclosure relates to a resistive random access memory (RRAM) cell architecture, with off-axis or laterally offset top electrode via (TEVA) and bottom electrode via (BEVA). Traditional RRAM cells having a TEVA and BEVA that are on-axis can cause high contact resistance variations. The off-axis TEVA and BEVA in the current disclosure pushes the TEVA away from the insulating layer over the RRAM cell, which can improve the contact resistance variations. The present disclosure also relates to a memory device having a rectangular shaped RRAM cell having a larger area that can lower the forming voltage and improve data retention.

20 Claims, 8 Drawing Sheets

(52) U.S. Cl.
CPC ........ *H01L 45/1286* (2013.01); *H01L 45/1293* (2013.01); *H01L 45/14* (2013.01); *H01L 45/141* (2013.01); *H01L 45/142* (2013.01); *H01L 45/143* (2013.01); *H01L 45/144* (2013.01); *H01L 45/145* (2013.01); *H01L 45/146* (2013.01); *H01L 45/147* (2013.01); *H01L 45/148* (2013.01); *H01L 45/149* (2013.01); *H01L 45/165* (2013.01); *H01L 45/1608* (2013.01); *H01L 45/1616* (2013.01); *H01L 45/1625* (2013.01); *H01L 45/1633* (2013.01); *H01L 45/1641* (2013.01); *H01L 45/1658* (2013.01); *H01L 45/1666* (2013.01); *H01L 45/1675* (2013.01); *H01L 45/1683* (2013.01); *H01L 45/1691* (2013.01)

(56) References Cited

U.S. PATENT DOCUMENTS

| | | | | |
|---|---|---|---|---|
| 7,582,889 | B2 * | 9/2009 | Asano | 257/4 |
| 7,906,817 | B1 * | 3/2011 | Wu et al. | 257/384 |
| 8,241,944 | B2 * | 8/2012 | Greeley et al. | 438/95 |
| 8,785,238 | B2 * | 7/2014 | Kawashima et al. | 438/102 |
| 2003/0080427 | A1 * | 5/2003 | Hudgens et al. | 257/748 |
| 2003/0116794 | A1 * | 6/2003 | Lowrey | 257/296 |
| 2005/0127349 | A1 * | 6/2005 | Horak et al. | 257/3 |
| 2005/0186768 | A1 * | 8/2005 | Sugaya et al. | 438/597 |
| 2006/0012029 | A1 * | 1/2006 | Kikuchi et al. | 257/700 |
| 2006/0046379 | A1 * | 3/2006 | Symanczyk et al. | 438/238 |
| 2006/0054878 | A1 * | 3/2006 | Lowrey | 257/3 |
| 2006/0060909 | A1 | 3/2006 | Chi et al. | |
| 2006/0072370 | A1 * | 4/2006 | Kuh et al. | 365/232 |
| 2006/0091476 | A1 * | 5/2006 | Pinnow et al. | 257/379 |
| 2006/0169968 | A1 * | 8/2006 | Happ | 257/2 |
| 2007/0120580 | A1 * | 5/2007 | Kim et al. | 326/93 |
| 2007/0158633 | A1 * | 7/2007 | Lai et al. | 257/4 |
| 2007/0278470 | A1 * | 12/2007 | Pellizzer et al. | 257/4 |
| 2008/0006851 | A1 * | 1/2008 | Moriya et al. | 257/246 |
| 2008/0093591 | A1 * | 4/2008 | Khang et al. | 257/4 |
| 2008/0093592 | A1 * | 4/2008 | Moriya | 257/4 |
| 2008/0149910 | A1 * | 6/2008 | An et al. | 257/4 |
| 2008/0247214 | A1 * | 10/2008 | Ufert | 365/148 |
| 2008/0293224 | A1 * | 11/2008 | Son et al. | 438/487 |
| 2008/0303015 | A1 * | 12/2008 | Happ et al. | 257/5 |
| 2009/0148981 | A1 * | 6/2009 | Lai et al. | 438/102 |
| 2010/0110758 | A1 * | 5/2010 | Li et al. | 365/148 |
| 2010/0237313 | A1 * | 9/2010 | Mikawa et al. | 257/2 |
| 2010/0237317 | A1 * | 9/2010 | Tsunoda | 257/4 |
| 2010/0252796 | A1 * | 10/2010 | Noshiro | 257/4 |
| 2010/0323491 | A1 * | 12/2010 | Moniwa et al. | 438/381 |
| 2011/0049460 | A1 * | 3/2011 | Breitwisch et al. | 257/3 |
| 2011/0096595 | A1 * | 4/2011 | Terai | 365/163 |
| 2011/0121251 | A1 * | 5/2011 | Breitwisch et al. | 257/4 |
| 2011/0233696 | A1 * | 9/2011 | Li | 257/421 |
| 2011/0254126 | A1 * | 10/2011 | Kreupl et al. | 257/532 |
| 2012/0037875 | A1 * | 2/2012 | Rolbiecki et al. | 257/2 |
| 2012/0142160 | A1 * | 6/2012 | Han et al. | 438/381 |
| 2012/0161095 | A1 * | 6/2012 | Mikawa et al. | 257/4 |
| 2012/0268981 | A1 * | 10/2012 | Hanzawa et al. | 365/148 |
| 2012/0299063 | A1 * | 11/2012 | Baba | 257/208 |
| 2013/0001504 | A1 * | 1/2013 | Ninomiya et al. | 257/4 |
| 2013/0089949 | A1 | 4/2013 | Phatak et al. | |
| 2013/0099386 | A1 * | 4/2013 | Lee | 257/773 |
| 2013/0140516 | A1 * | 6/2013 | Lee et al. | 257/5 |
| 2013/0170291 | A1 * | 7/2013 | Liu | 365/163 |
| 2013/0187114 | A1 * | 7/2013 | Kai et al. | 257/3 |
| 2013/0221308 | A1 * | 8/2013 | Toh et al. | 257/2 |
| 2013/0221310 | A1 * | 8/2013 | Morikawa et al. | 257/2 |
| 2013/0248795 | A1 * | 9/2013 | Takahashi et al. | 257/1 |
| 2013/0295745 | A1 * | 11/2013 | Takahashi et al. | 438/382 |
| 2014/0021584 | A1 * | 1/2014 | Tu et al. | 257/532 |
| 2014/0034891 | A1 * | 2/2014 | Wang et al. | 257/2 |
| 2014/0110659 | A1 * | 4/2014 | Murase et al. | 257/4 |
| 2014/0113430 | A1 * | 4/2014 | Hayakawa et al. | 438/385 |
| 2014/0124728 | A1 * | 5/2014 | Kim et al. | 257/5 |
| 2014/0131650 | A1 * | 5/2014 | Tu et al. | 257/4 |
| 2014/0138600 | A1 * | 5/2014 | Satoh et al. | 257/3 |
| 2014/0146593 | A1 * | 5/2014 | Tsai et al. | 365/148 |
| 2014/0151776 | A1 * | 6/2014 | Beigel et al. | 257/315 |
| 2014/0158964 | A1 * | 6/2014 | Han et al. | 257/2 |
| 2014/0175366 | A1 * | 6/2014 | Tu et al. | 257/4 |
| 2014/0179068 | A1 * | 6/2014 | Samachisa et al. | 438/128 |
| 2014/0225053 | A1 * | 8/2014 | Fujii et al. | 257/2 |
| 2014/0227853 | A1 * | 8/2014 | Matamis et al. | 438/382 |
| 2014/0252297 | A1 * | 9/2014 | Chang et al. | 257/4 |
| 2014/0264222 | A1 * | 9/2014 | Yang et al. | 257/2 |
| 2014/0264229 | A1 | 9/2014 | Yang et al. | |
| 2014/0264233 | A1 * | 9/2014 | Tu et al. | 257/4 |
| 2014/0284543 | A1 * | 9/2014 | Ishikawa et al. | 257/4 |

OTHER PUBLICATIONS

Notice of Allowance dated Jun. 30, 2015 for U.S. Appl. No. 14/252,111.

* cited by examiner

RRAM CELL STRUCTURE WITH LATERALLY OFFSET BEVA/TEVA

BACKGROUND

Non-volatile memories are used in a wide variety of commercial and military electronic devices and equipment. Embedded flash memory devices are used to store data and executable programs in integrated chips. As the functionality of an integrated chip increases, the need for more memory also increases, causing integrated chip designers and manufacturers to have to both increase the amount of available memory while decreasing the size and power consumption of an integrated chip. To reach this goal, the size of memory cell components has been aggressively shrunk over the past few decades. As the process technology migrates to smaller cell sizes, the integration of floating gate with high-k metal gate becomes complicated and expensive for embedded flash memory. Resistive random access memory (RRAM) is one promising candidate for next generation non-volatile memory technology due to its simple structure and CMOS logic compatible process technology that is involved.

The RRAM cell is a metal oxide material sandwiched between top and bottom electrodes. However, traditional RRAM cells can cause high contact resistance variations at the top electrode via. The current disclosure aims at lowering the contact resistance variation, lowering forming voltage and improving data retention.

DETAILED DESCRIPTION

Figure 1A:
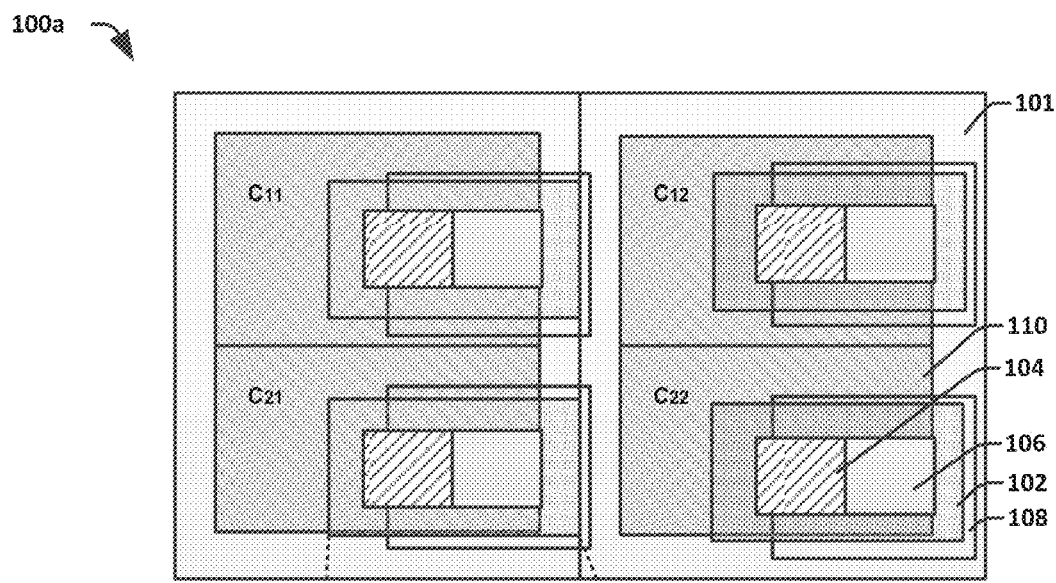
FIG. 1A illustrates a top view of some embodiments of a resistive random access memory (RRAM) device according to the present disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

A RRAM cell includes two electrodes with a resistive switching element placed between the two electrodes. Resistive switching elements or a variable resistive dielectric layer use a "forming process" to prepare a memory device for use. The forming process is typically applied at the factory, at assembly, or at initial system configuration. A resistive switching material is normally insulating, but a sufficient voltage (known as a forming voltage) applied to the resistive switching material will form one or more conductive pathways in the resistive switching material. Through the appropriate application of various voltages (e.g. a set voltage and reset voltage), the conductive pathways may be modified to form a high resistance state or a low resistance state. For example, a resistive switching material may change from a first resistivity to a second resistivity upon the application of a set voltage, and from the second resistivity back to the first resistivity upon the application of a reset voltage.

A RRAM cell may be regarded as storing a logical bit, where the resistive switching element has increased resistance, the RRAM cell may be regarded as storing a "0" bit; where the resistive switching element has reduced resistance, the RRAM cell may be regarded as storing a "1" bit, and vice-versa. A circuitry may be used to read the resistive state of the resistive switching element by applying a read voltage to the two electrodes and measuring the corresponding current through the resistive switching element. If the current through the resistive switching element is greater than some predetermined baseline current, the resistive switching element is deemed to be in a reduced resistance state, and therefore the RRAM cell is storing a logical "1." On the other hand, if the current through the resistive switching element is less than some predetermined baseline current, then the resistive switching element is deemed to be in an increased resistance state, and therefore the RRAM cell is storing a logical "0."

RRAM cells have conductive interconnects comprising a top electrode via (TEVA) and a bottom electrode via (BEVA) that connects the top and bottom electrodes to the rest of the device. In traditional RRAM cells, they are located along a same vertical axis. In such cases, an anti-reflective layer that may remain above the top electrode would cause high contact resistance on the TEVA if the TEVA is placed at that location.

Accordingly, the present disclosure relates to a new architecture for RRAM cells that can improve the contact resistance variation at the top electrode via. In some embodiments, conductive interconnects, comprising the TEVA and the BEVA are laterally offset, so that the TEVA is away from the insulating antireflective layer which can reduce the contact resistance variations. Furthermore, the shape and dimensions of the RRAM cell is chosen in such a way that it accommodates the conductive interconnects at both ends within an area of the RRAM cell. A small cell size and high density memory may bring adverse effects to associated logic circuitry like stress around RRAM area for abnormal dopant diffusion and junction leakage, lower yield, reliability concerns, etc. This can cause an increase in the forming voltage. The larger area would help reduce the forming voltage and also improve the data retention of the memory device.

FIG. 1A illustrates a top view of a memory device 100a in accordance with some embodiments that includes a number of memory cells arranged in a series of columns and rows. Memory array 101 comprises a plurality of memory cells configured to store data. For purposes of illustration, FIG. 1A's memory cells are arranged in two rows and two columns wherein the individual cells are labeled $C_{row-column}$, although typical embodiments will include thousands, millions or other numbers of rows and columns that collectively establish a memory array to store digital data. Memory cell $C_{22}$ comprises an RRAM cell 102 that is sandwiched between a top electrode via 104 and a bottom electrode via 106. The bottom electrode via 106 is in contact with a first metal contact associated with an area 108. The semiconductor substrate over which the memory cell is disposed is illustrated by reference numeral 110.

Figure 1B:
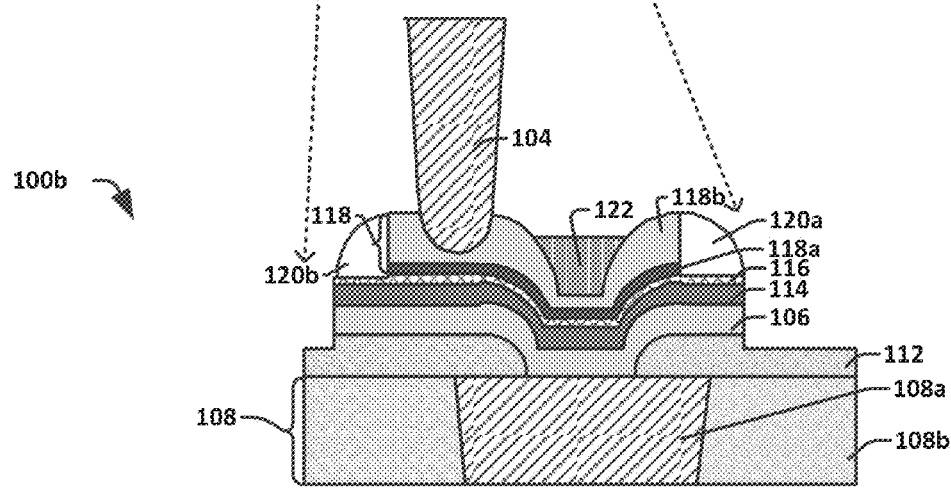
FIG. 1B illustrates a cross sectional view of one of the RRAM cells of the RRAM device in FIG. 1 according to some embodiments of the present disclosure.

FIG. 1B illustrates the cross sectional image of the memory cell C21 along a length of the RRAM cell of the memory cell C21. The RRAM cell resides over a semiconductor area 108 comprising a conductive region 108a such as metal which has extremely low-k dielectric region 108b on either side. Right above the semiconductor area 108 resides a dielectric protection layer 112 having an open region above the metal region 108a, wherein sidewalls of dielectric protection layer 112 culminate with rounded ends above the metal 108a. The dielectric protection layer 112 protects the semiconductor area 108 from future etching steps. In one embodiment, a bottom electrode via (BEVA) 106 resides over a defined region above the dielectric protection layer, follows the shape of the rounded ends of the dielectric protection layer 112 in a dipping fashion and resides over the open region contacting the metal 108a in the semiconductor area 108. A bottom electrode (BE) 114 resides above the BEVA, abutting the top surface of the BEVA. A variable resistive dielectric layer or resistive switching element 116 resides abutting the entire surface of the BE. A top electrode (TE) 118 resides above the variable resistive dielectric layer 118 116 at a defined region. In one embodiment the top electrode 118 comprises a first TE layer 118a and a second TE layer 118b that resides on top of first TE 118a. Two spacers 120a and 120b are disposed on either side of the TE 118. The spacers 120a and 120b also reside on the two end locations of the variable resistive dielectric layer 116. A top electrode via (TEVA) 104 is located at one side of the second TE layer 118b. This location makes the TEVA 104 laterally offset from the BEVA/metal interface or the conductive interconnect that connects the bottom of the RRAM cell with the rest of the device. An antireflective layer 122 is disposed above the second TE layer 118b at a location different from the TEVA location. The antireflective layer 122 is situated vertically above the metal region 108a, in an indention above the TE layer 118b and resides in such location incidentally due to manufacturing process, as will be more appreciated later in the disclosure.

Figure 2:
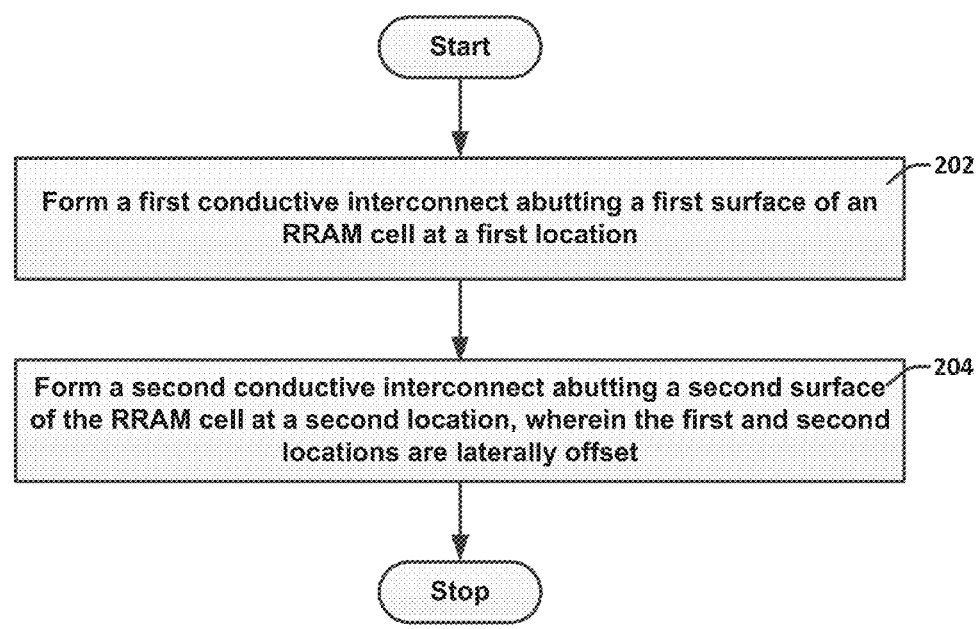
FIG. 2 illustrates a flow diagram of some embodiments of a method for forming an RRAM device according to the present disclosure.

FIG. 2 illustrates a flow diagram of some embodiments of a method 200 for forming an RRAM device with laterally offset BEVA and TEVA according to the present disclosure.

While disclosed method 200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 202, a first conductive interconnect is formed abutting a first surface of an RRAM cell at a first location.

At 204, a second conductive interconnect is formed abutting a second, different surface of the RRAM cell at a second location such that, the first and second locations are laterally offset from one another. In one embodiment, the first surface is a bottom surface of the RRAM cell while the second surface is a top surface of the RRAM cell.

Figure 3:
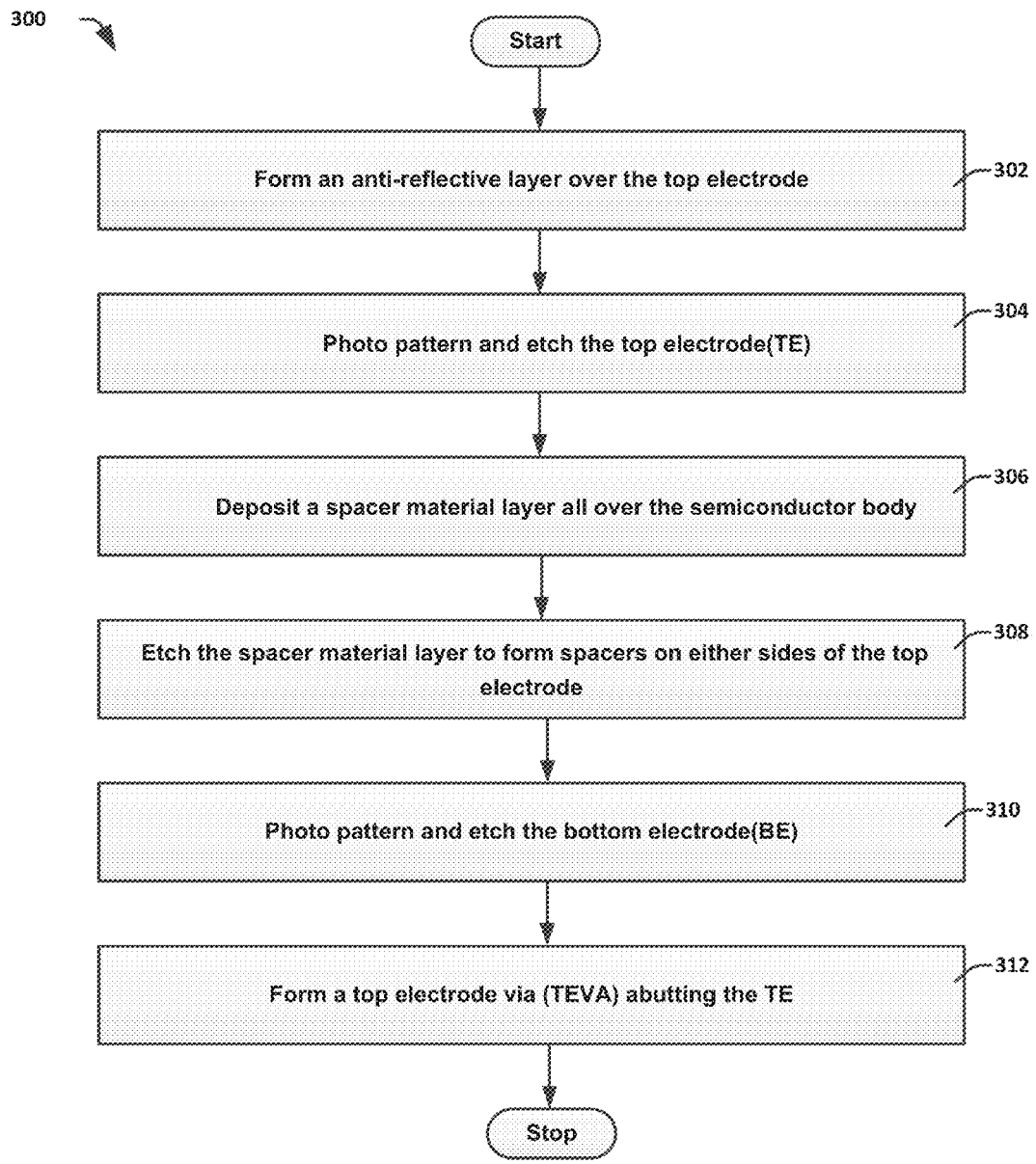
FIG. 3 illustrates a flow diagram of some embodiments of a method for forming a top electrode via on an RRAM cell according to the present disclosure.

FIG. 3 illustrates a flow diagram of some embodiments of a method 300 for forming a top electrode via (TEVA) on an RRAM cell according to the present disclosure.

While disclosed method 300 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, an antireflective/insulating layer is deposited over the top electrode of the RRAM cell. This antireflective layer protects the RRAM surface from future photo-patterning and etching steps that may take place over the RRAM cell. In some embodiments, the antireflective layer deposited over the TE comprises silicon oxy-nitride (SiON).

At 304, a photolithographic step that includes an anisotropic etch is carried out to pattern and etch the top electrode leaving the variable resistive dielectric layer open or otherwise exposed at two end locations. In some embodiments, the photolithographic step does not completely remove the antireflective layer at a location that overlies the top electrode and some of it is left at a center location vertically above the metal region that forms the bottom contact associated with the BEVA. In some embodiments, the antireflective layer is completely removed in the etching step.

At 306, a spacer material is deposited all over the semiconductor body to form a single layer over the entire RRAM cell. In some embodiments, the spacer material comprises silicon nitride (SiN).

At 308, the spacer material is etched to form spacers on both ends of the top electrode. The spacers reside on the open, exposed end locations of the variable resistive dielectric layer.

At 310, another photolithographic step is carried out that etches the bottom electrode at defined regions, leaving the protective dielectric layer open at its two end locations.

At 312, a top electrode via (TEVA) is formed abutting the top electrode at a location that is laterally disposed away from the center location. This will make sure the TEVA is not in contact with the insulating antireflective layer and thus there is no increase in contact resistance unlike conventional arrangements. The TEVA is also laterally offset from the conductive interconnect that connects the bottom of the RRAM cell to the rest of the device.

Figure 4:
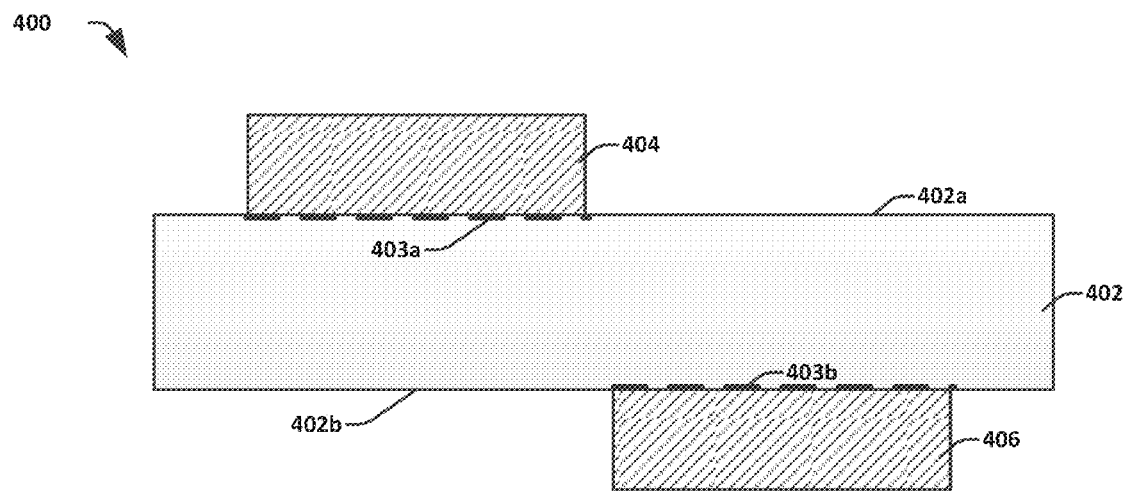
FIG. 4 illustrates a cross sectional view of some embodiments of a laterally offset top electrode via (TEVA) and bottom electrode via (BEVA) on a memory cell, according to the present disclosure.

FIG. 4 illustrates a cross sectional view of some embodiments of a RRAM device 400 which has an overlying conductive interconnect and an underlying conductive interconnect that are laterally offset from one another, according to the present disclosure. An RRAM cell 402 is sandwiched between two conductive interconnects that are laterally offset. Reference numeral 404 represents the overlying conductive interconnect that abuts the top surface 402a of the RRAM cell 402 and reference number 406 represents the underlying conductive interconnect that abuts the bottom surface 402b of the RRAM cell 402. The highlighted dotted region on the top surface 402a represents a first location 403a at which the overlying conductive interconnect is disposed and the highlighted dotted region 403b on the bottom surface 402b represents a second location 403b at which the underlying conductive interconnect is disposed. The first location 403a and the second location 403b are laterally offset from one another. The concept of lateral offsetting is explained in detail in the following figures.

FIGS. 5A-5D illustrate some embodiments of laterally offset and not laterally offset objects. In order to explain laterally offsetting two objects, two axes that are perpendicular to a horizontal plane and that pass through the centers of two objects are introduced. If the axes are separated by a non-zero distance, then the two objects are said to be laterally offset or off-axis.

Figure 5A:
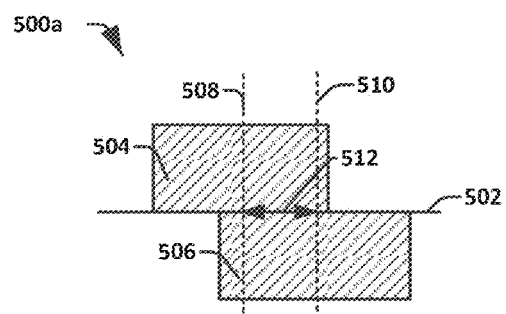
FIGS. 5A-5D illustrate some embodiments of laterally offset and not laterally offset structures according to the present disclosure.

FIG. 5A illustrates an arrangement 500a of two laterally offset objects 504 and 506 along a horizontal or lateral axis 502. 508 is a first axis that passes through the center of object 504 and 510 is a second axis that passes through the center of object 506. A non-zero distance which is observed between the two axes is represented by the reference numeral 512. Here, even though the objects are seen to be overlapping at a distance along the horizontal axis 502, the distance between the axes 512 shows that objects 504 and 508 are laterally offset or off-axis with respect to one another.

Figure 5B:
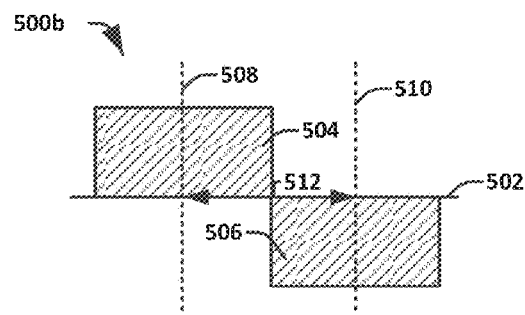

FIG. 5B represents an arrangement 500b of another embodiment of laterally offset objects. In this case, the corners of objects 504 and 506 touch at a single point along the lateral axis 502. However, there is a non-zero distance 512 between the perpendicular axes 508 and 510 and hence the objects 504 and 506 are laterally offset or off-axis with respect to one another.

Figure 5C:
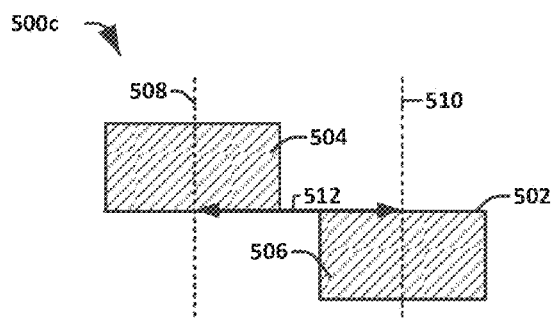

FIG. 5C shows another yet embodiment of laterally offset objects in an arrangement 500c. Here the objects 504 and 506 have no connecting region along the horizontal axis 502. Hence there is a very distinct non-zero distance between the axes 508 and 510 and the objects are laterally offset or off-axis with respect to one another.

Figure 5D:
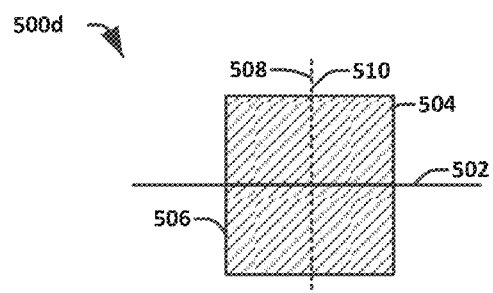

FIG. 5D represents an arrangement 500d that illustrates an embodiment where two objects are not laterally offset or on-axis. No distance is observed between the two axes 508 and 510 or the two axes coincide with one another which makes the two objects 504 and 506 on-axis or not laterally offset with respect to one another.

Figure 6:
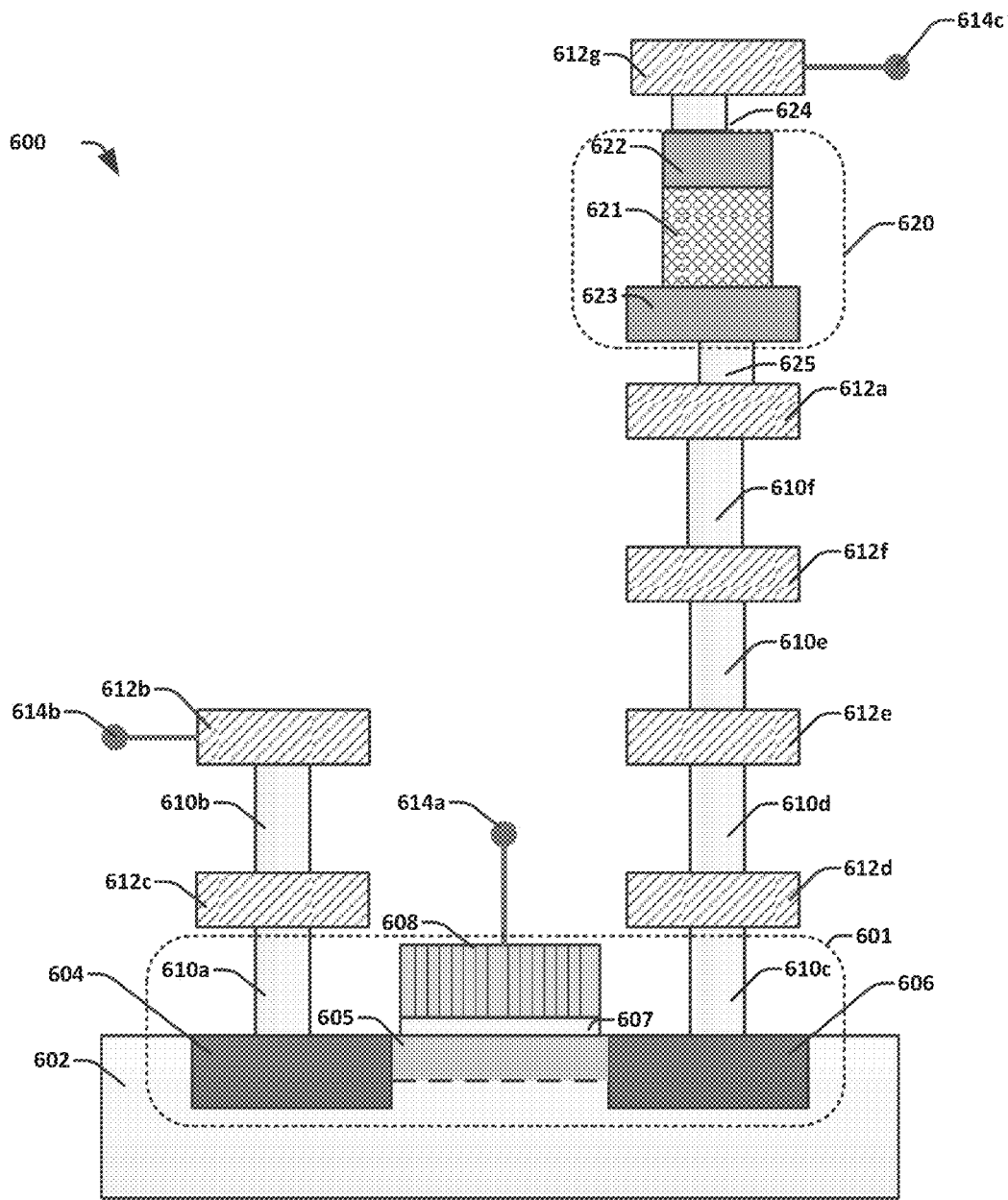
FIG. 6 illustrates a cross sectional view of some embodiments of an RRAM device with a laterally offset TEVA and BEVA according to the present disclosure.

FIG. 6 illustrates a cross sectional view of some embodiments of an RRAM device 600 with a laterally offset TEVA and BEVA according to the present disclosure. A plurality of such RRAM devices form a memory array configured to store data. In one embodiment a selection transistor is associated with each RRAM device. The selection transistor is configured to suppress sneak-path leakage (i.e., prevent current intended for a particular memory cell from passing through an adjacent memory cell) while providing enough driving current for memory cell operation. FIG. 6 comprises a conventional planar MOSFET selection transistor 601. The selection transistor 601 comprises a source 604 and a drain 606 comprised within a semiconductor body 602, separated horizontally by a channel region 605. A gate electrode 608 is located on the semiconductor body 602 at a position that is above the channel region 605. In some embodiments, the gate electrode comprises poly silicon. The gate electrode 608 is separated from the source 604 and drain 606 by a gate oxide layer or gate dielectric layer 607 extending laterally over the surface of the semiconductor body 602. The drain 606 is connected to a data storage element or RRAM cell 620 by way of a first metal contact 612a. The source 604 is connected by way of a second metal contact 612b. The gate electrode is connected to a word line 614a, the source is connected to a select line 614b through the second metal contact 612b and the RRAM cell 620 is further connected to a bit line 614c comprised within an upper metallization layer by way of an additional metal contact 612g. A desired RRAM device may be selectively accessed using word lines and bit lines for reading, writing and erasing operations. One or more metal contacts comprising 612c, 612d, 612e, 612f and metal contact vias comprising 610a, 610b, 610c, 610d, 610e, 610f etc. that helps in connecting the RRAM memory device with the external circuitry may be present between the drain and the first metal contact, and between the source and the second metal contact. In some embodiments, the metal contacts comprise copper (Cu).

The RRAM cell 620 comprises a resistive switching element/variable resistive dielectric layer 621 sandwiched between a top electrode 622 and a bottom electrode 623. In some embodiments, the top electrode comprises titanium (Ti) and tantalum nitride (TaN), the bottom electrode comprises titanium nitride (TiN), and the resistive switching element comprises hafnium dioxide (HfO2). A top electrode via (TEVA) 624 connects the top electrode 622 of the memory cell 620 to the upper metallization layer 612g and a bottom electrode via (BEVA) 625 connects the bottom electrode 623 of the RRAM cell 620 to the first metal contact/lower metallization layer 612a. The TEVA 624 and the BEVA 625 are positioned in a laterally offset manner with respect to one another in order to lower the contact resistance that may build up between the TEVA 624 and the underlying insulator layer (not shown), that resides in a central location above the top electrode 622. The RRAM cell 620 also has an enlarged generally rectangular or elongated area so as to accommodate the laterally offset TEVA and BEVA. The larger elongated area can lower the forming voltage and also improve data retention in the RRAM cell.

FIGS. 7A-7F show cross sectional images of various embodiments of corresponding method 300 wherein a top electrode via (TEVA) is formed according to the present disclosure.

Figure 7A:
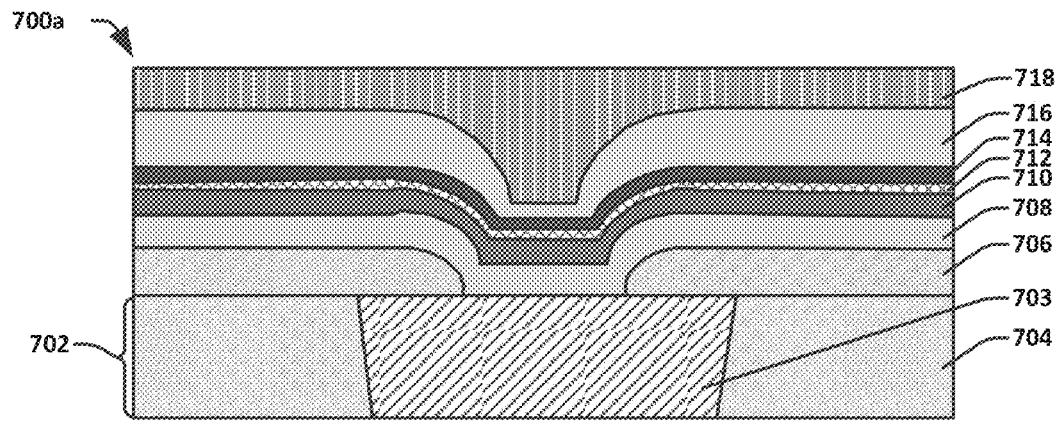
FIGS. 7A-7F illustrate embodiments of cross sectional images of a method of formation of a TEVA according to the present disclosure.

FIG. 7A shows a cross-sectional image of an embodiment of a semiconductor body 700a that comprises an RRAM cell, a BEVA and an underlying metal interconnect. The semiconductor body 700a comprises a semiconductor area 702 comprising a conductive metal region 703 disposed within an insulating layer such as an extremely low-k dielectric layer 704. In some embodiments, the metal region comprises copper (Cu) and the extremely low-k dielectric layer comprises porous silicon dioxide, fluorinated silica glass, polyimides, polynorbornenes, benzocyclobutene, or PTFE. A dielectric protection layer 706 having an open region above the metal, wherein sidewalls of dielectric protection layer end with rounded ends above the metal due to etching, is disposed above the semiconductor area 702. In some embodiments, the dielectric protection layer comprises silicon carbide (SiC). A bottom electrode via (BEVA) 708 resides conformally over a defined region above the dielectric protection layer 706. It follows the shape of the rounded ends of the dielectric protection layer in a dipping fashion and also resides over the open region contacting the metal 703 in the semiconductor area 702. In some embodiments, the BEVA comprises tantalum nitride (TaN). A bottom electrode (BE) 710 resides entirely over the BEVA, and above the BE resides a variable resistive dielectric layer 712. The variable resistive dielectric layer is normally insulating, but a sufficient voltage applied to the variable resistive dielectric material will form one or more conductive pathways in the variable resistive dielectric. Through the appropriate application of various voltages (e.g. a set voltage and reset voltage), the conductive pathways may be modified to form a high resistance state or a low resistance state. In some embodiments, the BE 710 comprises titanium nitride (TiN) and the variable resistive dielectric layer comprises hafnium dioxide (HfO2). On top of the variable resistive dielectric layer 712 resides a first top electrode layer 714 and abutting that layer, a second top electrode layer 716 is disposed. In some embodiments the first top electrode layer comprises titanium (Ti) and the second top electrode layer comprises TaN. Abutting the entire second top electrode layer 716, an insulating anti-reflective layer 718 is deposited. This layer protects the underlying layers from the future etching steps and operated to improve patterning by reducing light reflection that causes standing waves. In some embodiment, the anti-reflective layer comprises SiON.

Figure 7B:
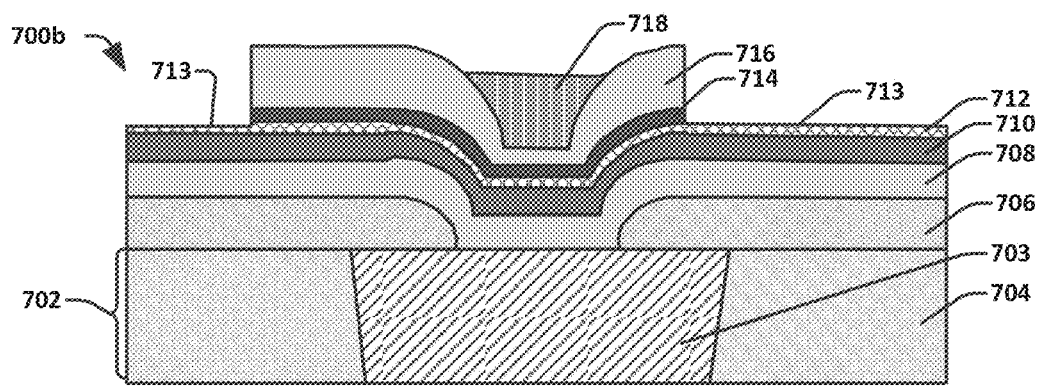

FIG. 7B shows an embodiment of a semiconductor body 700b after photo patterning and etching the top electrode (TE). In some embodiments, an anisotropic etching step is carried out, creating open, exposed ends 713 for the variable resistive dielectric layer at two end locations. In one embodiment, the photolithographic step does not completely remove the antireflective layer 718 from the second top electrode layer 716 and some of it is left at a center location vertically above the metal region. In another embodiment, the antireflective layer is completely removed in the etching step.

Figure 7C:
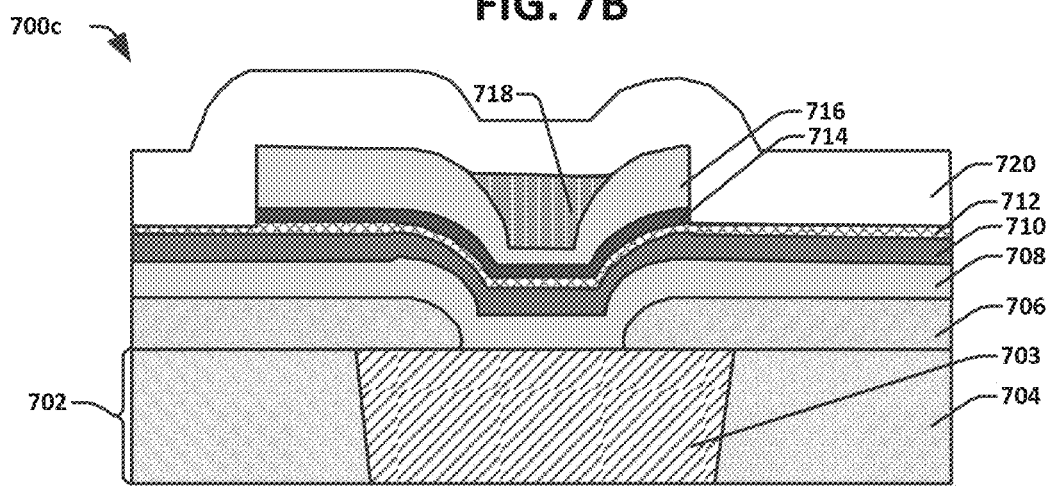

FIG. 7C shows an embodiment of a semiconductor body 700c after a spacer material is deposited all over the semiconductor body to form a spacer layer 720 entirely over the semiconductor body. In some embodiments, the spacer material comprises silicon nitride (SiN).

Figure 7D:
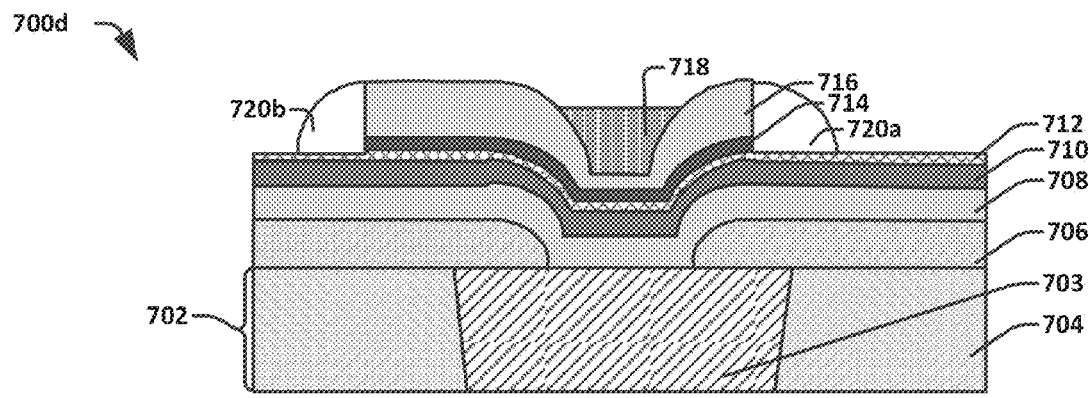

FIG. 7D shows an embodiment of a semiconductor body 700d after the spacer layer 720 is etched to form spacers 720a and 720b on both ends of the top electrode. The spacers 720a and 720b reside on the open end locations of the variable resistive dielectric layer.

Figure 7E:
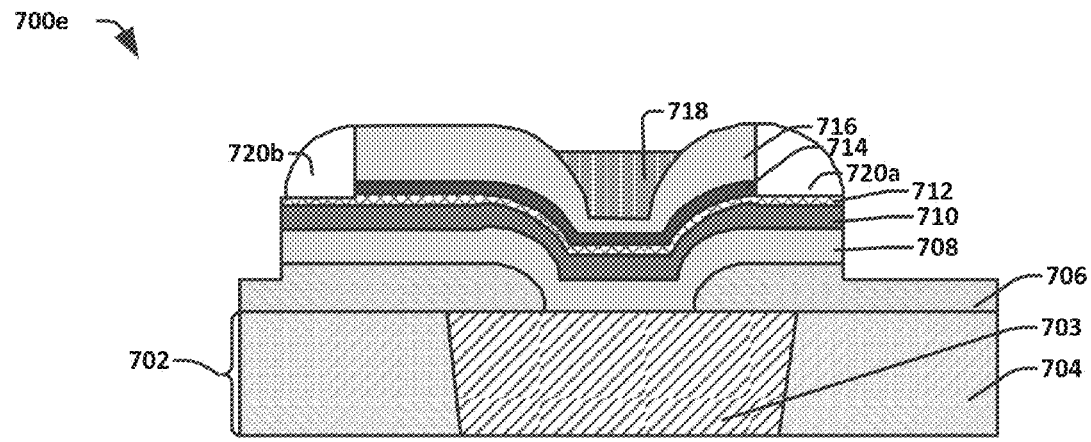

FIG. 7E shows an embodiment of a semiconductor body 700e after another photolithographic step is carried out that etches the bottom electrode 710 and the variable resistive dielectric layer 712 at defined regions. This etching step will leave the protective dielectric layer open at its two end locations.

Figure 7F:
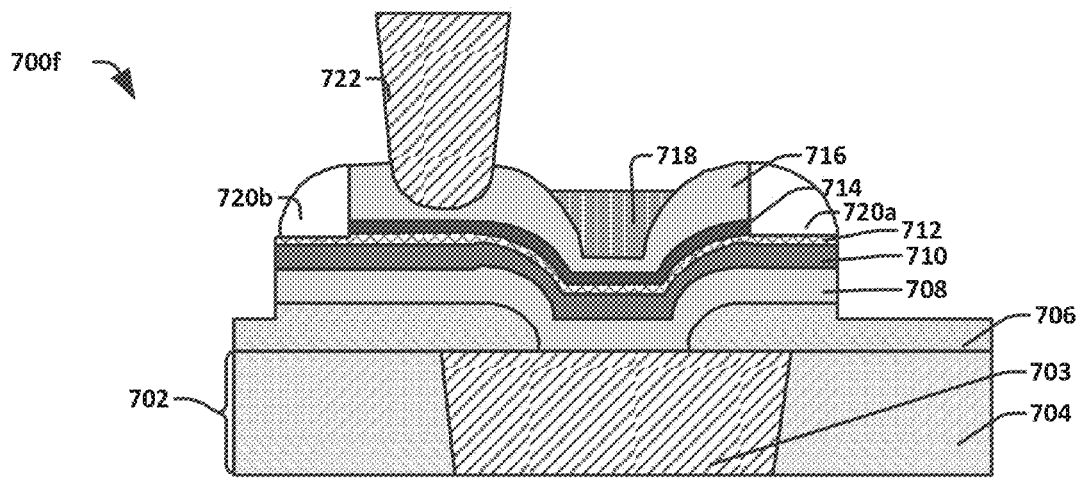

FIG. 7F shows an embodiment of a semiconductor body 700f after the formation of a top electrode via (TEVA) 722 at a location away from the dipping region. This will make sure the TEVA is not in contact with the insulating antireflective layer 718 and thus this construction improves the contact resistance variation significantly when compared with conventional designs. Thus the TEVA is laterally offset from the conductive interconnect that connects the bottom of the RRAM cell to the rest of the device.

Figure 8:
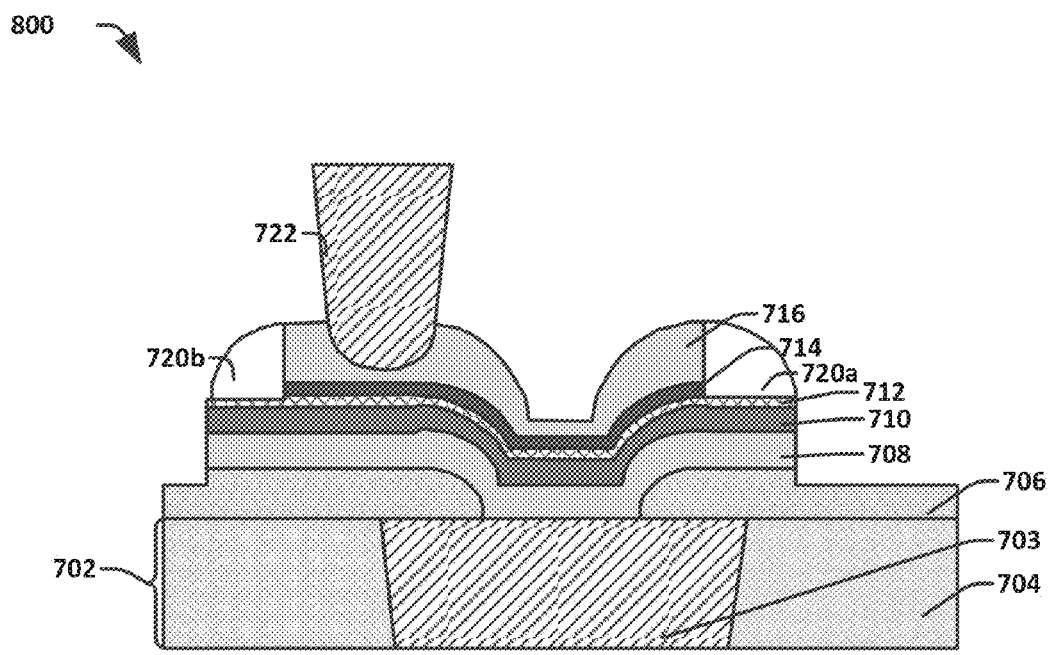
FIG. 8 illustrates a cross sectional view of some embodiments of an RRAM device with a laterally offset TEVA and BEVA with no insulating material abutting the top electrode.

FIG. 8 shows an embodiment of an RRAM device 800 having laterally offset TEVA and BEVA according to the present disclosure, as well as a top electrode surface that has no insulating anti-reflective layer. In this case, the anti-reflective layer is completely removed during step 304 of method 300.

It will be appreciated that while reference is made throughout this document to exemplary structures in discussing aspects of methodologies described herein that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby.

For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

The present disclosure relates to resistive random access memory (RRAM) device comprising a resistive random-access memory (RRAM) cell having a first surface and a second surface, a first conductive interconnect abutting the first surface at a first location and, a second conductive interconnect abutting the second surface at a second location, wherein the first and second locations are laterally offset.

In some embodiments, the present disclosure relates to a resistive random access memory (RRAM) device, comprising, a semiconductor body having a source region and a drain region horizontally separated by a channel region, a gate structure coupled to the channel region, a first contact and a second contact extending upwardly from the drain and source regions, respectively, a first conductive interconnect formed over the first contact and electrically coupled to the first contact, a resistive random-access memory (RRAM) cell formed over the first conductive interconnect and having a first surface and a second surface, wherein the first surface is coupled to the first conductive interconnect at a first location, a second conductive interconnect formed over the RRAM cell and abutting the second surface at a second location, wherein the first and second locations are laterally offset.

In another embodiment, the present disclosure relates to a method of forming a resistive random-access memory (RRAM) device comprising, forming an overlying conductive interconnect abutting a first surface of an RRAM cell at a first location, and forming an underlying conductive interconnect abutting a second surface of an RRAM cell at a second location, wherein the first and second locations are laterally offset.

What is claimed is:

1. A resistive random access memory (RRAM) device comprising:
   a variable resistive dielectric layer;
   a top electrode disposed over the variable resistive dielectric layer and having a recess thereon;
   a top electrode via (TEVA) arranged within an inter-layer dielectric (ILD) layer and abutting the to electrode at a first location; and
   an insulating anti-reflective layer disposed within the recess and abutting the top electrode at a second location, wherein the first and second locations are laterally offset from one another.

2. The RRAM device of claim 1, further comprising:
   a bottom electrode disposed below the variable resistive dielectric layer;

and
a bottom electrode via (BEVA) that abuts the bottom electrode.

3. The RRAM device of claim 2 further comprising:
a semiconductor area comprising a metal disposed within an extremely low-k dielectric layer formed thereover;
a dielectric protection layer having an open region above the metal, wherein sidewalls of dielectric protection layer end with rounded ends above the metal; and,
spacers located on opposing sides of the top electrode.

4. The RRAM device of claim 3, wherein:
the BEVA resides over a defined region above the dielectric protection layer, follows a shape of the rounded ends of the dielectric protection layer in a dipping fashion and resides over the open region contacting the metal in the semiconductor area;
the bottom electrode is disposed entirely over the BEVA;
the variable resistive dielectric layer is disposed entirely over the BE bottom electrode;
the top electrode resides over a defined region above the variable resistive dielectric layer; and
the TEVA resides at a location that is laterally offset from the open region.

5. The RRAM device of claim 2, further comprising a length dimension and a breadth dimension constituting an area, and wherein the TEVA and the BEVA are disposed within the area.

6. The RRAM device of claim 1, where in a shape of the RRAM device is rectangular.

7. The RRAM device of claim 4, wherein the top electrode comprises Tantalum Nitride (TaN) over Titanium (Ti), the bottom electrode comprises titanium nitride (TiN), the TEVA comprises copper (Cu), the BEVA comprises TaN, the variable resistive dielectric layer comprises Hafnium oxide (HfO), the spacer comprises silicon nitride (SiN) and the insulating anti-reflective layer comprises silicon ox nitride (SiON).

8. A resistive random access memory (RRAM) device, comprising:
a semiconductor body having a source region and a drain region horizontally separated by a channel region;
a gate structure disposed over the channel region;
a first contact and a second contact extending upwardly from the drain and source regions, respectively;
a dielectric protection layer having an opening disposed above the first contact;
a bottom electrode via (BEVA) disposed over the first contact and electrically coupled to the first contact, wherein the BEVA abuts the first contact at a first location through the opening;
a RRAM cell formed over the BEVA and having a first surface and a second surface, wherein the first surface is coupled to the BEVA and the second surface has a recess positioned vertically above the first location; and
a top electrode via (TEVA) disposed over the RRAM cell and abutting the second surface at a second location, wherein the first and second locations are laterally offset with respect to one another.

9. The RRAM device of claim 8 further comprising, an insulating anti-reflective layer disposed within the recess on the second surface.

10. The RRAM device of claim 8, wherein the BEVA resides above the dielectric protection layer and follows a shape of rounded ends of the dielectric protection layer in a dipping fashion, to abut the first contact.

11. The RRAM device of claim 8, wherein the gate structure is coupled to a word line.

12. The RRAM device of claim 8, wherein the gate structure comprises a poly-silicon gate electrode formed over a gate dielectric which electrically isolates the gate electrode from the channel region.

13. The RRAM device of claim 8, wherein one or more metal contacts and one or more metal contact vias exist between the source region and the second contact and between the drain region and the first contact.

14. The RRAM device of claim 8, wherein the source region is coupled to a source line and the drain region is coupled to a bit line.

15. The RRAM device of claim 8, wherein the source and drain regions have a first conductivity and the semiconductor body has a second conductivity.

16. A resistive random access memory (RRAM) cell of a memory device, comprising:
a variable resistive dielectric layer having a top surface and a bottom surface;
a top electrode (TE) disposed over the top surface of the variable resistive dielectric layer;
a bottom electrode (BE) disposed below the bottom surface of the variable resistive dielectric layer;
a top electrode via (TEVA) that abuts the top electrode, wherein the TEVA is centered at a first location;
a bottom electrode via (BEVA) that abuts the bottom electrode wherein the BEVA is centered at a second location which is laterally offset from the first location;
a semiconductor body having a source region and a drain region horizontally separated by a channel region;
a gate structure disposed over the channel region and connected to a word line;
a first overlying contact coupled to the source region and connected to a source line; and
a second overlying contact disposed above the TEVA, coupled to the drain region through the RRAM cell, and connected to a bit line.

17. The memory device of claim 16, further comprising:
a semiconductor area comprising a metal disposed within an extreme low-k dielectric layer formed thereover;
a dielectric protection layer having an open region above the metal, wherein sidewalls of dielectric protection layer end with rounded ends above the metal;
an insulating anti-reflective layer abutting the top electrode above the open region; and
spacers located on opposing sides of the top electrode.

18. The memory device of claim 17, wherein:
the bottom electrode via (BEVA) resides over a defined region above the dielectric protection layer, follows a shape of the rounded ends of the dielectric protection layer in a dipping fashion and resides over the open region contacting the metal in the semiconductor area;
the bottom electrode is disposed entirely over the BEVA;
the variable resistive dielectric layer is disposed entirely over the BE; and
the top electrode resides over a defined region above the variable resistive dielectric layer.

19. The memory device of claim 17, wherein the first location of the TEVA is laterally offset from the open region and the insulating anti-reflective layer.

20. The memory device of claim 16, wherein the RRAM cell comprises a length dimension and a breadth dimension constituting an area, and wherein the TEVA and the BEVA are disposed within the area.

* * * * *